(12) United States Patent
Behm et al.

(10) Patent No.: US 7,291,285 B2
(45) Date of Patent: Nov. 6, 2007

(54) METHOD AND SYSTEM FOR LINE-DIMENSION CONTROL OF AN ETCH PROCESS

(75) Inventors: Gary Walter Behm, Hopewell Junction, NY (US); Teresita Quitua Magtoto, Poughkeepsie, NY (US); Rajiv M. Ranade, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 11/125,696

(22) Filed: May 10, 2005

(65) Prior Publication Data

US 2006/0255010 A1   Nov. 16, 2006

(51) Int. Cl.
*G01L 21/30* (2006.01)
(52) U.S. Cl. .................. 216/41; 216/67; 700/14; 700/121; 702/24; 702/31
(58) Field of Classification Search ............... None
See application file for complete search history.

(56) References Cited

U.S. PATENT DOCUMENTS

| | | | | |
|---|---|---|---|---|
| 6,368,982 B1 * | 4/2002 | Yu | ............................. | 438/753 |
| 6,960,775 B1 * | 11/2005 | Carpaij et al. | ......... | 250/492.22 |
| 7,107,115 B2 * | 9/2006 | Tanaka et al. | ............. | 700/109 |
| 7,142,938 B2 * | 11/2006 | Chi et al. | .................. | 700/106 |
| 7,153,709 B1 * | 12/2006 | Purdy et al. | .................. | 438/4 |
| 7,172,969 B2 * | 2/2007 | Xia et al. | ................... | 438/689 |
| 2002/0142252 A1 * | 10/2002 | Ng | ............................. | 430/313 |
| 2002/0164546 A1 * | 11/2002 | Brown et al. | .............. | 430/316 |
| 2003/0049876 A1 * | 3/2003 | Mori et al. | .................. | 438/23 |
| 2003/0093762 A1 * | 5/2003 | Rietman et al. | .............. | 716/2 |
| 2003/0228532 A1 * | 12/2003 | Mui et al. | .................... | 430/30 |
| 2005/0187649 A1 * | 8/2005 | Funk et al. | ................ | 700/121 |
| 2005/0221619 A1 * | 10/2005 | Yue et al. | ................... | 438/714 |
| 2006/0046323 A1 * | 3/2006 | Wang et al. | ................. | 438/14 |
| 2006/0064193 A1 * | 3/2006 | Yamashita et al. | ......... | 700/121 |

* cited by examiner

*Primary Examiner*—Allan Olsen
(74) *Attorney, Agent, or Firm*—Schmeiser, Olsen & Watts; Steven Capella

(57) ABSTRACT

A method and system for controlling a dimension of an etched feature. The method includes: measuring a mask feature formed on a top surface of a layer on a substrate to obtain a mask feature dimension value; and calculating a mask trim plasma etch time based on the mask feature dimension value, a mask feature dimension target value, a total of selected radio frequency power-on times of a plasma etch tool since an event occurring to a chamber or chambers of a plasma etch tool for plasma etching the layer, and an etch bias target for a layer feature to be formed from the layer where the layer is not protected by the mask feature during a plasma etch of the layer.

26 Claims, 8 Drawing Sheets

METHOD AND SYSTEM FOR LINE-DIMENSION CONTROL OF AN ETCH PROCESS

FIELD OF THE INVENTION

The present invention relates to the field of integrated circuit fabrication; more specifically, it relates method and system for etched line-dimension control in a plasma etch tool.

BACKGROUND OF THE INVENTION

One of the process steps utilized in the fabrication of integrated circuits is plasma etching. In plasma etching, a patterned mask is formed over a layer (on a semiconductor substrate) that is to be etched and exposed to etch species in generated in a plasma etch tool which removes the layer where it is not protected by the patterned mask. Control of the dimension of the structures so etched is critical to the proper performance of the integrated circuit and is effected by the amount of etch by-product polymer coating the chamber and fixtures within the chamber of the plasma etch tool. However, etched dimension control deteriorates as more and more substrates are etched in the tool and the chamber becomes coated with excessive amounts of polymer. Thus, plasma etch tools must be periodically cleaned to remove the excessive amounts of polymer and seasoned to restore a minimum amount of polymer required to for etch dimension control. However, cleaning and seasoning themselves can effect line dimension control as well.

Therefore, there is a need for method and system for etched line-dimension control in a plasma etch tool that takes into account chamber cleaning and seasoning effects.

SUMMARY OF THE INVENTION

The present invention utilizes tracking of total radio frequency (RF) power-on since the last performed cleaning and seasoning of the plasma chamber of a first plasma etch or reactive ion etch (RIE) tool time to adjust the etch time of a mask feature trim process prior to a second plasma etch or RIE of the underlying layer in order to control features sizes of features formed by the underlying layer by the second plasma etch or RIE.

A first aspect of the present invention is a method, comprising: measuring a mask feature of a patterned mask layer formed on a top surface of a layer on a substrate to obtain a mask feature dimension value; and calculating a mask trim plasma etch time for the patterned mask layer based on the mask feature dimension value, a mask feature dimension target value, a total of selected radio frequency power-on times of a plasma etch tool since an event occurring to a chamber or chambers of the plasma etch tool for plasma etching the layer, and an etch bias target for a layer feature to be formed from the layer where the layer is not protected by the mask feature during a plasma etch of the layer.

A second aspect of the present invention is a process control system, comprising a microprocessor and a memory unit coupled to communicate with the processor, the memory unit containing instructions that when executed implement a method for controlling an plasma etch process, the method comprising the microprocessor implemented steps of: determining a mask feature dimension value of a mask feature of a patterned mask layer formed on a top surface of a layer on a substrate; and calculating a mask trim plasma etch time for the patterned mask layer based on the mask feature dimension value, a mask feature dimension target value, a total of selected radio frequency power-on times of a plasma etch tool since an event occurring to a chamber or chambers of the plasma etch tool for plasma etching the layer, and an etch bias target for a layer feature to be formed from the layer where the layer is not protected by the mask feature during a plasma etch of the layer.

A third aspect of the present invention is a process control system, comprising: a mask trim etch time algorithm solver adapted to generate a mask trim plasma etch time and linked to a feed forward controller, the feed forward controller adapted to integrate the mask trim plasma etch time into a plasma etch tool process recipe; a radio frequency power-on collector adapted to collect plasma etch tool radio frequency power-on time and store a running total of radio frequency power-on time and linked to a data storage unit adapted to store the running total of radio frequency power-on time; a mask trim etch time algorithm updater linked between the data storage unit and the mask trim etch algorithm solver and adapted to transfer the running total of radio frequency power-on time to the mask trim etch time algorithm solver.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term plasma etch will be used throughout the description of the present invention. The terms plasma etch and plasma etching are to be understood to include all processes that generate charged or neutral radical species that are directed to a surface of a material to be etched including, but not limited to, such processes as the aforementioned RIE, and chemical downstream etching (DCE). A plasma etch process is one in which a plasma is generated at low pressure, an etchant is introduced into the plasma, the etchant is ionized or radicalized and the ionic or radical species allowed to react with the material to be etched.

The present invention will be described as the invention is applied to etching polysilicon gate structures on semiconductor substrates, but it should be understood that the invention is applicable to etching layers of any material etchable in a plasma etch process.

The inventors of the present invention have discovered that for the initial (about 10 or less) lots through a polysilicon plasma etch tool after chamber cleaning (often called wet cleaning or wet stripping) and seasoning, feature size control of the first few product lots etched in the plasma tool is poor and only improves after a number of product lots have etched. Chamber cleaning is performed to remove polymer buildup on the walls and component parts contained within the plasma etch chamber to prevent particulate contamination and to stabilize etch rates. A seasoning is generally performed after a chamber cleaning in order to recoat the chamber and component parts with a known layer of polymer and to stabilize etch rate. Further, the inventors have discovered not only does the present invention resolve this initial lot etched feature size control problem, but results in improved etched feature size control of all product lots processed through the tool, even the later processed products lots processed immediately before the next chamber cleaning and seasoning.

Figure 1A:
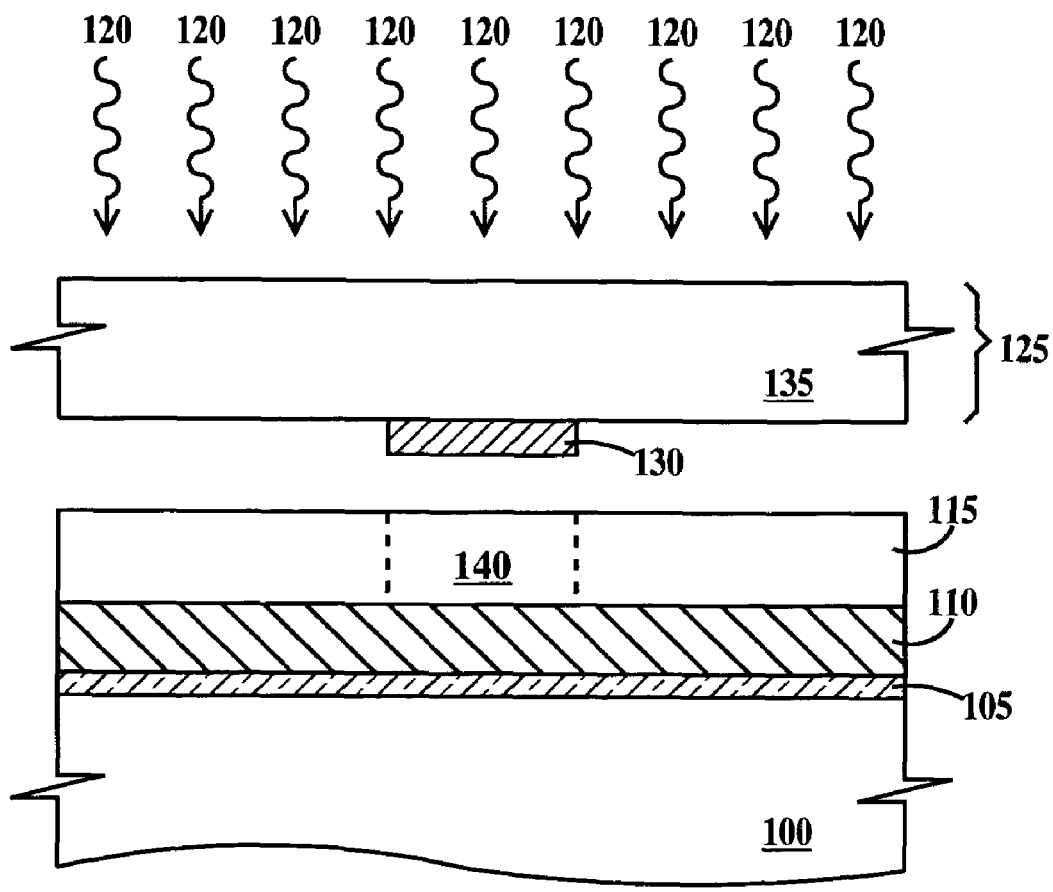
FIGS. 1A through 1E are cross-sectional views illustrating an exemplary fabrication of a etched line according to the present invention.

FIGS. 1A through 1E are cross-sectional views illustrating an exemplary fabrication of a etched line according to the present invention. In FIG. 1A, formed on a substrate 100 is a gate dielectric layer 105 and formed on gate dielectric layer 105 is a polysilicon layer 110. The polysilicon layer may be fully or partially doped with n-type and p-type dopants. Formed on polysilicon layer 110 is a photoresist layer 115. There are many types of photomasks, but in the present example, actinic radiation 120 is directed at photoresist layer 115 through a photomask 125 having an opaque (to actinic radiation 120) region 130 formed on a transparent (to actinic radiation 120) substrate 135. The exposure process creates a latent image 140 in photoresist layer 115.

Figure 1B:
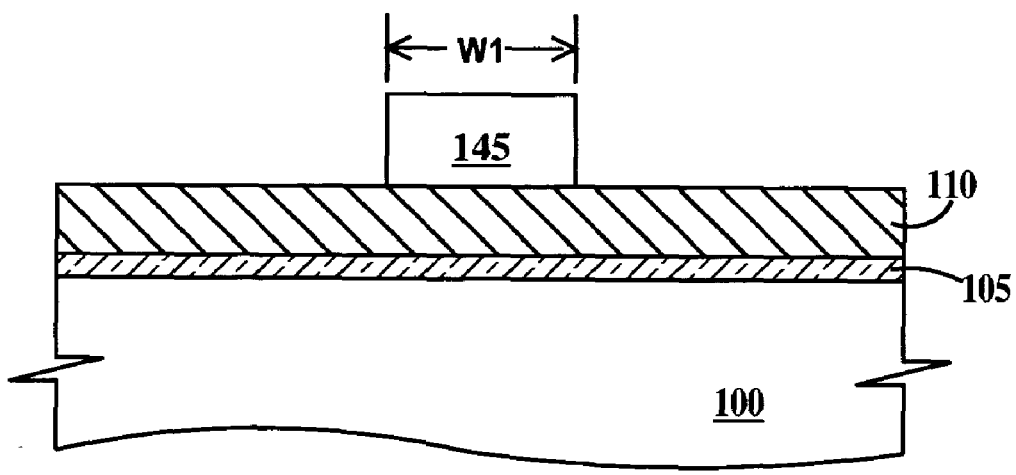

In FIG. 1B, after a development process, a photoresist feature 145 is formed on polysilicon layer 110 by removing regions of photoresist layer 115 (see FIG. 1A) exposed to actinic radiation 120 (see FIG. 1A). In the present example, photoresist layer 115 (see FIG. 1A) is a positive photoresist. Other photoresist systems including negative, dual tone and multilayer photoresist systems may be used. Photoresist feature 145 may be further processed by heating (post develop baking) or exposure to ultraviolet light (UV hardening) prior to measuring a control dimension of photoresist feature 145. In FIG. 1B, photoresist feature 145 has a dimension (or width) of W1 which is measured.

Figure 1C:
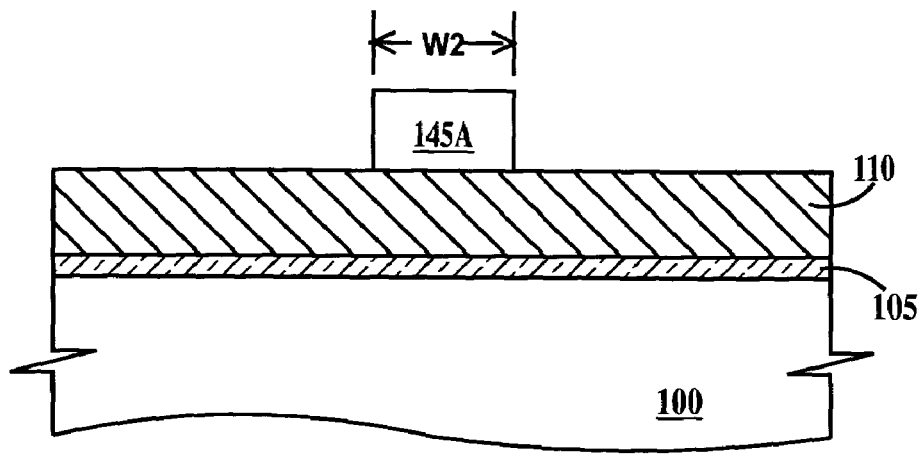
Figure 1D:
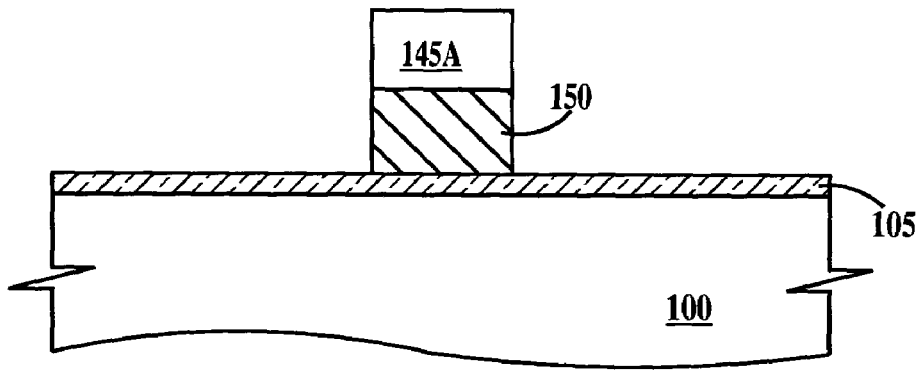

In FIG. 1C, a plasma etch mask trim process is performed on photoresist feature 145 of FIG. 1B to produce a photoresist feature 145A having a dimension (or width) W2. The plasma etch mask trim process removes a thin layer of photoresist from all exposed surfaces (top and sides) of photoresist feature 145 (see FIG. 1B) to produce photoresist feature 145A. The dimension W2 of photoresist feature 145A is less than the dimension W1 (see FIG. 1B) of photoresist feature 145.

In step 1D, a plasma polysilicon etch process is performed to form polysilicon feature 150, by removing all of polysilicon layer 110 (see FIG. 1C) not protected by photoresist feature 145A. The plasma etch mask trim process described supra and the plasma polysilicon etch process are may performed in the same plasma etch chamber in sequence, by changing reactive species during the while RF power is on. However, two separate chambers may be provided, one for plasma etch mask trim process and one for plasma polysilicon etch process.

Figure 1E:
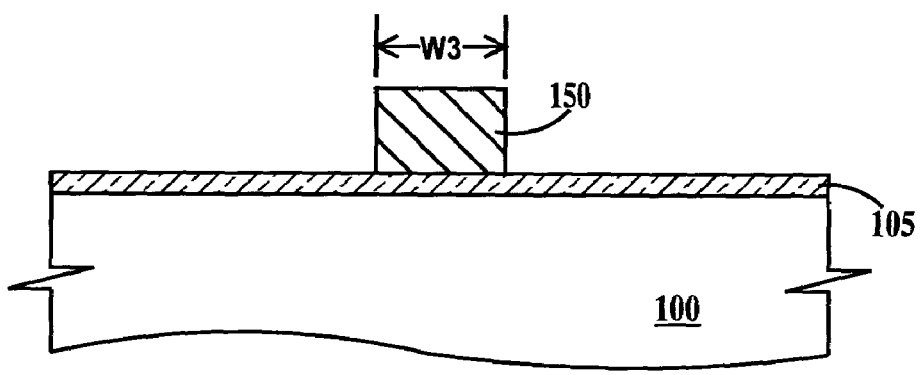

In FIG. 1E, photoresist feature 145A (see FIG. 1D) is removed and a dimension (or width) W3 of polysilicon feature 150 is measured. The dimension W3 of polysilicon feature 150 is less than the dimension W2 (see FIG. 1C) of photoresist feature 145A. Thus, the measured dimension W3 of polysilicon feature 150 is less than the measured dimension W1 of photoresist feature 145 (see FIG. 1B). The difference between W3 and W1 is the etch bias of the polysilicon plasma etch process.

Figure 2A:
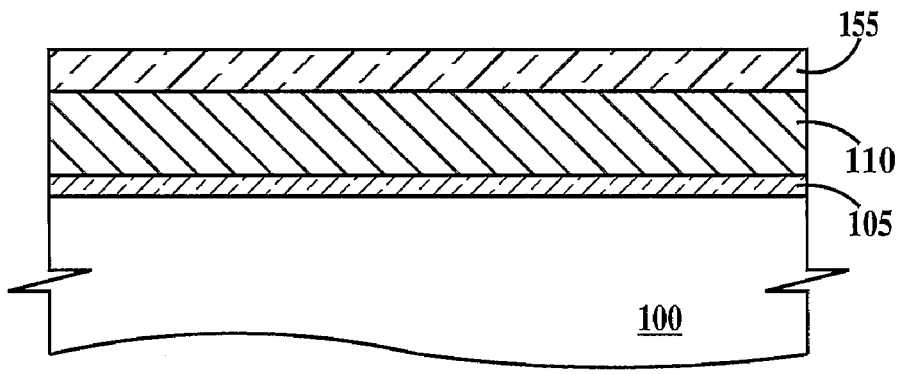
FIGS. 2A through 2E are cross-sectional views illustrating fabrication of a etched line according to alternative embodiments of the present invention.

FIGS. 2A through 2D are cross-sectional views illustrating fabrication of a etched line according to alternative embodiments of the present invention. In FIG. 2A, formed on substrate 100 is gate dielectric layer 105 and formed on gate dielectric layer 105 is polysilicon layer 110 and formed on polysilicon layer 110 is a hard mask layer 155. In one example, hard mask layer 155 is a dielectric layer.

Figure 2B:
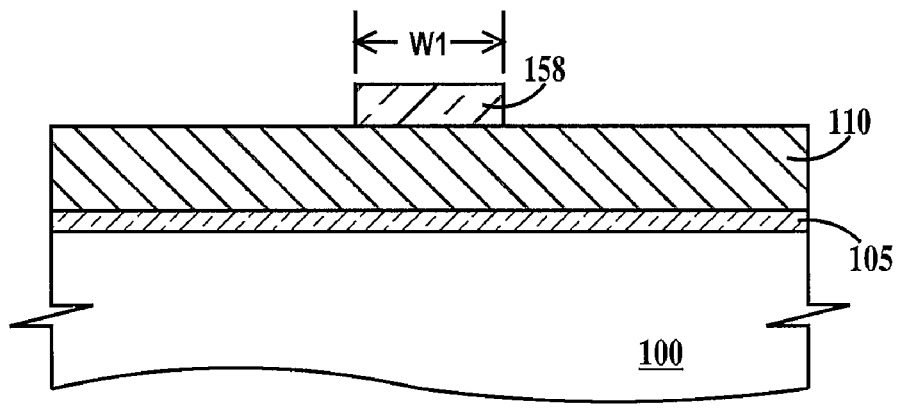

In FIG. 2B, a lithographic process similar to that described supra in reference to FIG. 1A has been performed, followed by a etching of hard mask layer 155 and removal of the photoresist layer to form a hard mask feature 158 having dimension (or width) W1 which is measured.

Figure 2C:
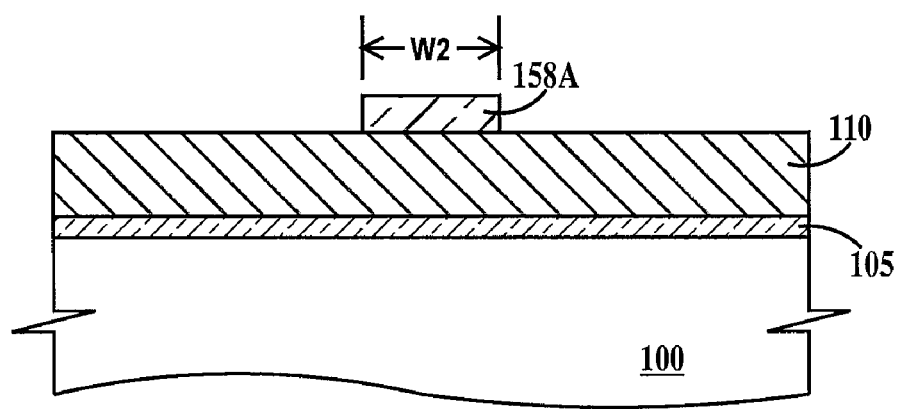

In FIG. 2C, a plasma etch mask trim process is performed on hard mask feature 158 of FIG. 2B to produce a hard mask feature 158A having dimension (or width) W2. The plasma etch mask trim process removes a thin layer of hard mask material from all exposed surfaces (top and sides) of hard mask feature 158 (see FIG. 2B) to produce hard mask feature 158A. The dimension W2 of hard mask feature 158A is less than the dimension W1 (see FIG. 2B) of hard mask feature 158.

Figure 2D:
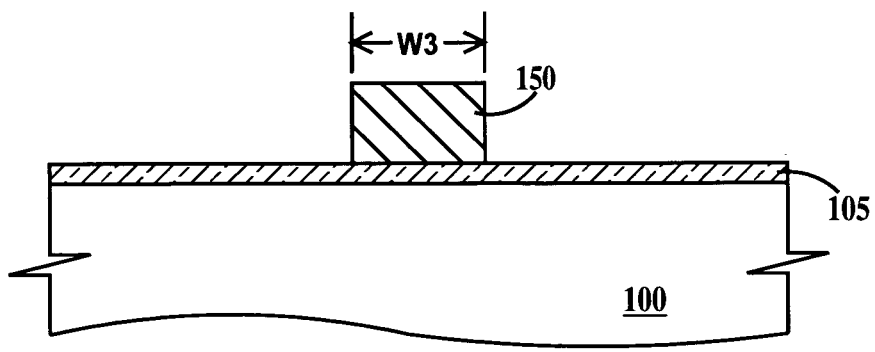
Figure 2E:
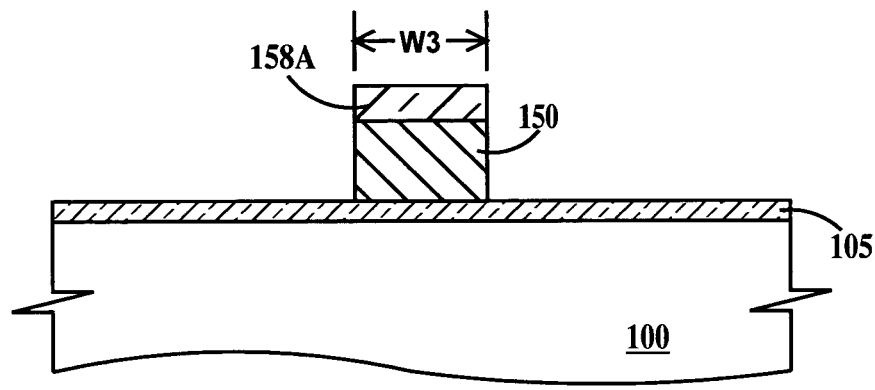

In FIG. 2D, after a polysilicon plasma etch process, hard mask feature 158A (see FIG. 2C) is removed and dimension (or width) W3 of polysilicon feature 150 is measured. In a third embodiment, as illustrated in FIG. 2E, hard mask feature 158A is not removed and W3 is a measure of the dimension (or width) of hard mask feature after exposure to the polysilicon etch process.

Figure 3:
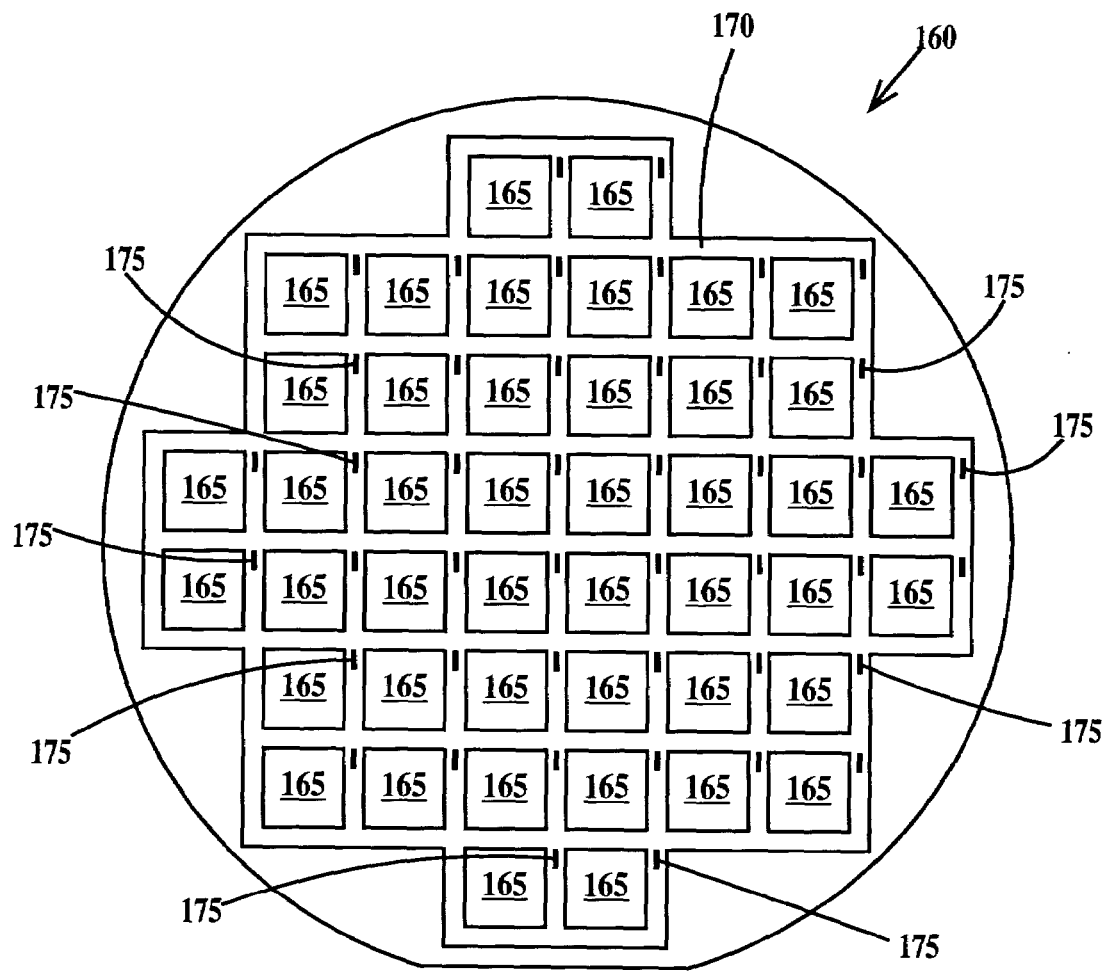
FIG. 3 is a top view of a semiconductor substrate during fabrication according to the present invention.

FIG. 3 is a top view of a semiconductor substrate during fabrication according to the present invention. In FIG. 3, a semiconductor substrate (or wafer) under fabrication includes an array of integrated circuit chips 165 separated by dicing channels (also called kerfs or streets) 170. Within dicing channels 170 are a multiplicity of measurement structures 175. The measured dimension W3 of polysilicon feature 150 (see FIG. 1E) and the measured dimension W1 of photoresist feature 145(see FIG. 1B) are measured on features of measurement structures 175. Alternatively, W1 and W3 may be determined by measurement of features within integrated circuit chips 165.

Figure 4:
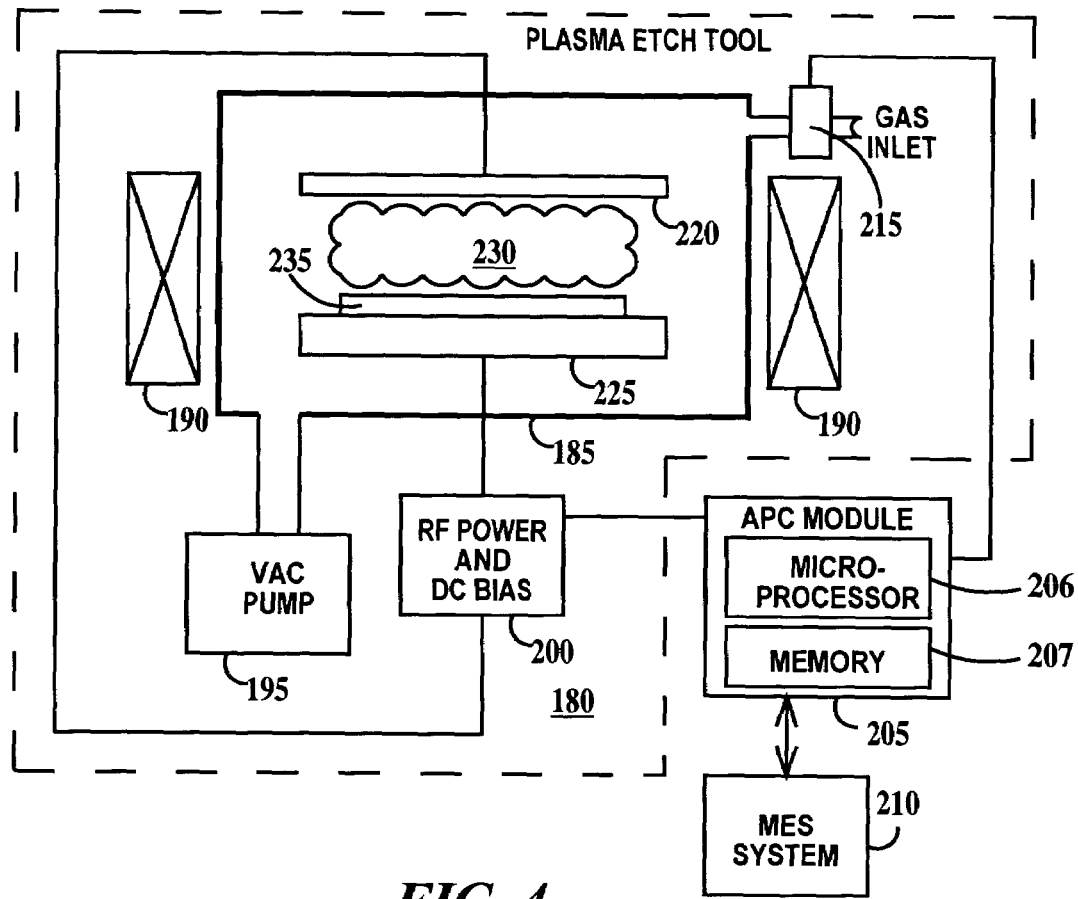
FIG. 4 is schematic diagram of an exemplary plasma etch tool according to the present invention.

FIG. 4 is schematic diagram of an exemplary plasma etch tool 180 according to the present invention. In FIG. 4, plasma etch tool 180 includes a chamber 185, optional magnets 190, an exhausted vacuum pump 195 and an RF power and DC bias circuit 200. Plasma etch system is controlled by an automated process control (APC) module 205. APC module 205 is linked to an SPC database through a manufacturing execution system (MES) 210 and to gas inlet valves 215. Chamber 185 is fitted with solenoid gas inlet valves 215 (only one shown) for introducing plasma and etchant gases into the chamber. Within chamber 185 are an upper plate 220 and a lower plate 225. RF power and DC bias circuit 200 is coupled to upper plate 220 and lower plate 225. An RF signal applied across the upper and lower plates generates a plasma 230. A substrate 235 to be etched is placed on lower plate 225 with the surface to be etched facing plasma 230. Magnets 190 help to generate, shape and sustain plasma 190.

Figure 7:
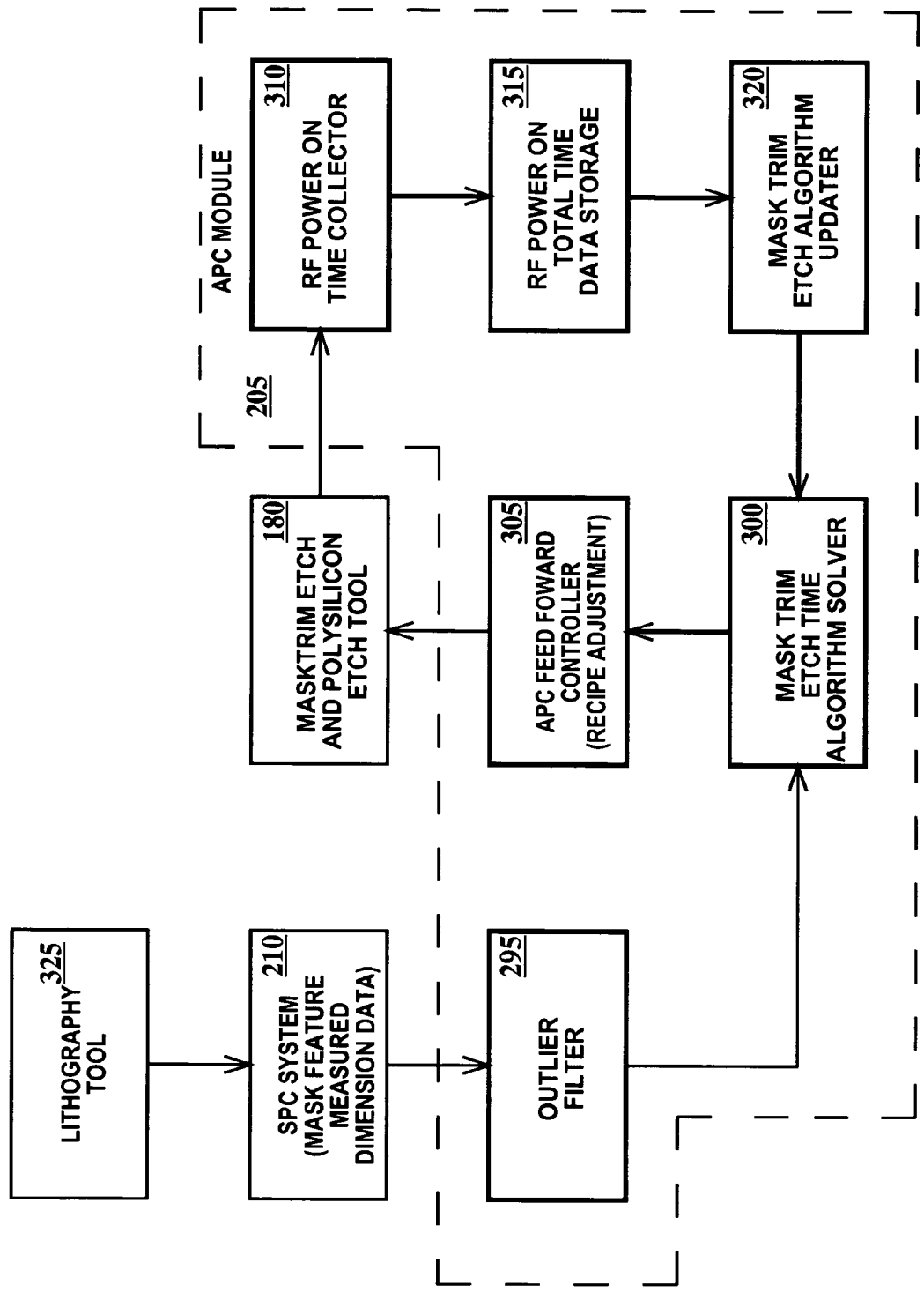
FIG. 7 is a system diagram of a system architecture for etched line-dimension control in a plasma etch tool according to the present invention.

APC module 205 includes a microprocessor 206 and a memory storage device 207. Memory storage device 207 stores etch recipes comprising lists of parameter settings as instructions for controlling the operation of plasma etch system 180, tool information (such as a running total of RF power-on time) and product information (such as etched feature target dimension values) and instructions for calculating certain parameters such as mask trim plasma etch time. Recipes include values for etch parameters such as etch time, gas selection, chamber pressure, gas flow rate, pump throttle position, RF power, RF power ramp rate, DC bias voltage and other parameters for each etch process as well as linking information when two different etch processes, such as mask trim plasma etch and polysilicon plasma etch, are to be performed sequentially. Microprocessor 207 can access SPC system 210 in order to retrieve mask feature dimension W1 measurement data for the lot being processed and perform calculations based on the retrieved data, stored data and stored instructions determine recipe and adjust the recipe for the mask trim etch time for a substrate or group of substrates. APC module 205 is illustrated in FIG. 7 and described in more detail infra. In one example, plasma etch tool 180 is a single substrate (wafer) tool, as only on substrate at a time is etched in chamber 185. However, the present invention is applicable to batch plasma etc tools, in which two or more substrates (wafers) are etched at the same time.

Figure 5:
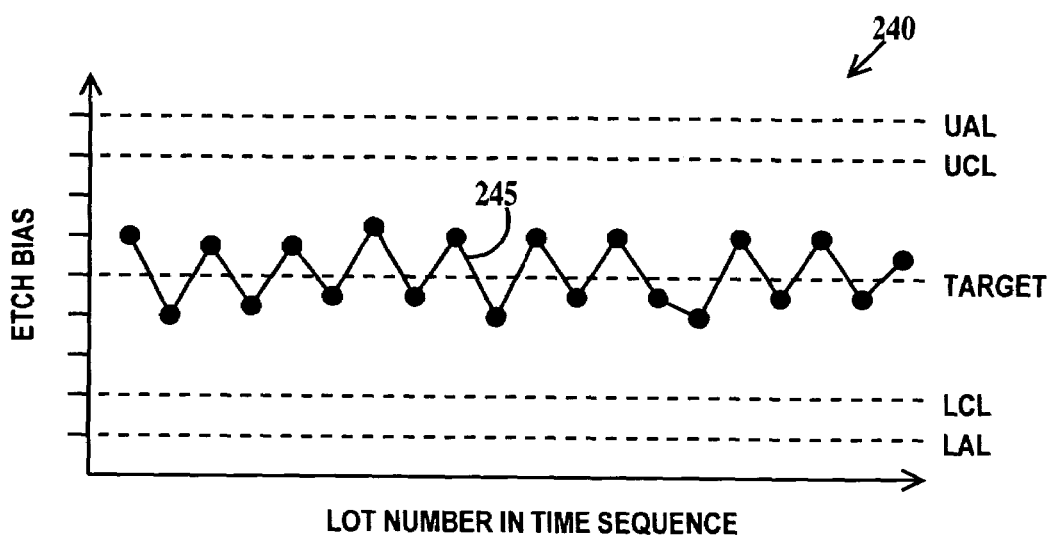
FIG. 5 is an exemplary statistical process control (SPC) chart according to the present invention.

FIG. 5 is an exemplary SPC chart 240 according to the present invention. In FIG. 5, polysilicon etch bias 245 which is measured mask feature dimension W1 minus measured polysilicon feature dimension W3 (W1−W3) for each lot is plotted in time sequence though a same plasma etch system. In one example, the plotted value of etch bias for each lot is the average of 48 measurements of mask feature dimensions W1 minus 48 measurements of polysilicon feature dimension W3 where 12 measurements are performed on each of four substrates for each lot of substrates. In one example, a lot of substrates is 25 substrates. In one example, each of the 48 dimensions W3 of the polysilicon feature are measured on the identical measurement structures on the same substrate as the 48 dimensions W1 of the mask feature were measured, though the positions of the 12 measurement structures on each of the four substrates may be unique. In chart 240, a target value, upper control limit (UCL), lower control limit (LCL), upper action limit (UAL) and lower action limit (LAL) are shown.

Figure 6:
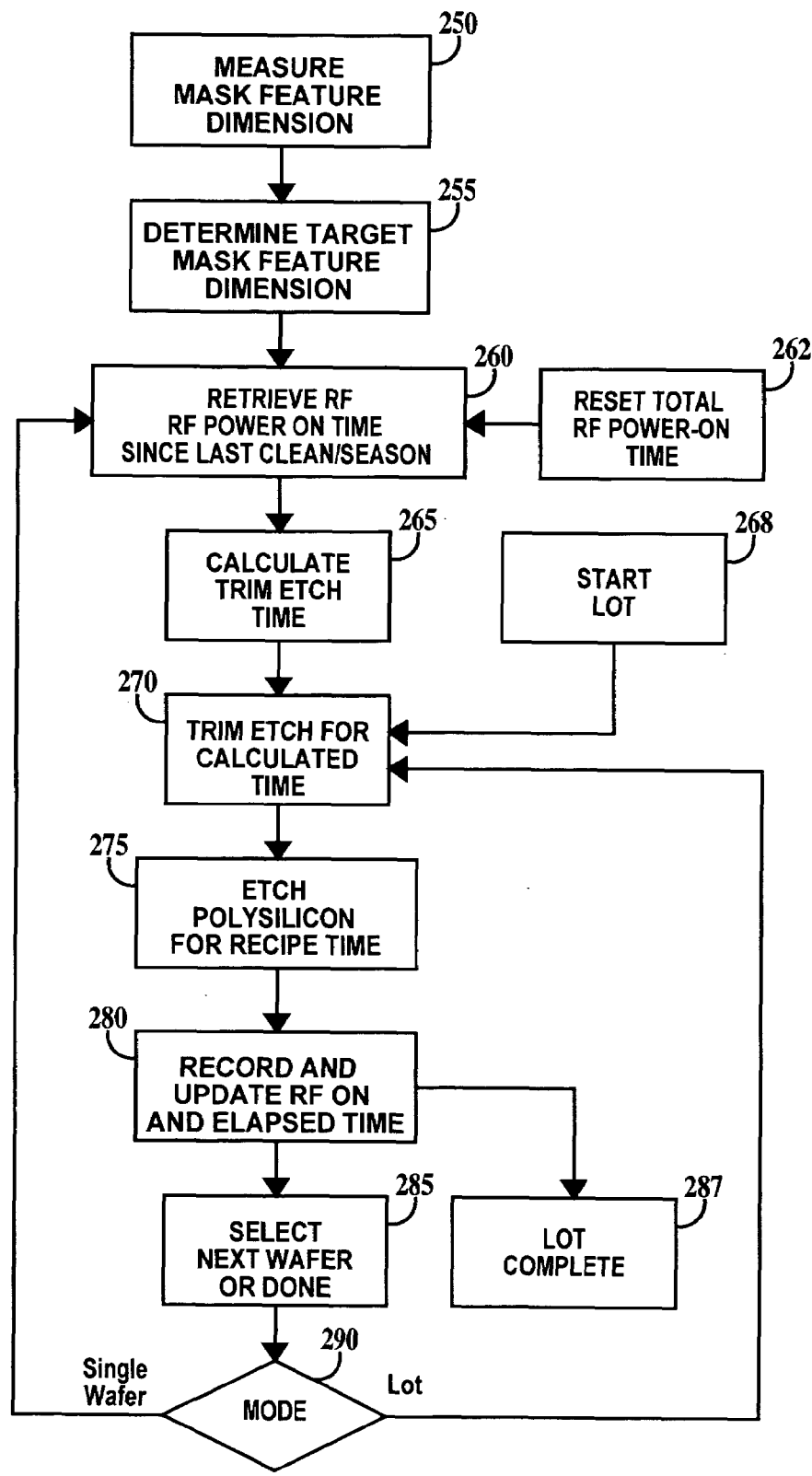
FIG. 6 is a flowchart of the method for etched line-dimension control in a plasma etch tool according to the present invention.

FIG. 6 is a flowchart of the method for etched line-dimension control in a plasma etch tool according to the present invention. In step 250, the mask feature dimension (W1) for a lot to be plasma etched is measured. In step 255, a target dimension (WT1) for the mask feature is retrieved from an SPC data base. In step 260, the total RF power-on time since the last chamber cleaning and/or seasoning of the plasma etch system that will be used to etch the current lot is determined.

The RF power-on time is reset in step 262, to 0 hours after a cleaning and to about 4 hours after a cleaning followed by a seasoning. In one example, a cleaning is performed after every 450 RF power-on hours. Generally step 262 is inhibited until etching of all wafers of any lot started is completed.

In step 265 an etch time for the mask trim etch process is calculated based on the empirical relationship that holds over certain ranges of variables that are different for different minimum ground-rule technologies:

$$T_{TRIM} = (1 + T_{BIAS})^{(1+(\frac{W1-WT1}{WT1}))^2} + \left(1 + \frac{1}{T_{RF}^{C1}}\right)\ln(T_{RF})^{C2} \quad (1)$$

where:

WT1=said mask feature dimension target in microns;

$T_{TRIM}$=said mask trim plasma etch time in seconds over a range based upon a value of WT1;

$T_{BIAS}$=said etch bias target in seconds over a range based upon said value of WT1;

W1=said mask feature dimension in microns over a range based upon said value of WT1;

$T_{RF}$=said total amount of selected radio frequency power-on times in hours since the last cleaning and seasoning over a range based upon said value of WT1; and C1 and C2 are empirically determined based upon a value of WT1.

In a first example:

$T_{TRIM}$=the amount of time (in seconds over the range of about 22 seconds to about 35 seconds) to perform the mask trim process;

$T_{BIAS}$=the amount of time (in seconds over the range of about 18 seconds to about 27 seconds) to perform the mask trim etch process to meet a target value of (W1−W3) based on an empirical relationship between (W1−W3) and $T_{BIAS}$;

W1=measured mask feature dimension (in microns over a range of about 0.112 microns to about 0.118 microns);

W3=measured etched polysilicon feature dimension (in microns over a range of about 0.057 microns to about 0.061 microns);

WT1=the target value for the mask feature measurement W1 of 0.115 micron;

(W1−WT1) is in the range of about 0.−0.003 microns to about +0.003 microns);

C1=1 (dimensionless); and

C2=1 (dimensionless).

In a second example:

$T_{TRIM}$=the amount of time (in seconds over the range of about 22 seconds to about 35 seconds) to perform the mask trim process;

$T_{BIAS}$=the amount of time (in seconds over the range of about 18 seconds to about 27 seconds) to perform the mask trim etch process to meet a target value of (W1−W3) based on an empirical relationship between (W1−W3) and $T_{BIAS}$;

W1=measured mask feature dimension (in microns over a range of about 0.082 microns to about 0.088 microns);

W3=measured etched polysilicon feature dimension (in microns over a range of about 0.057 microns to about 0.061 microns);

WT1=the target value for the mask feature measurement W1 of 0.085 micron;

(W1−WT1) is in the range of about −0.003 microns to about +0.003 microns);

C1=0.1 (dimensionless); and

C2=1.5 (dimensionless).

For both the first and second example;

$T_{RF}$=a total amount of RF power-on timed elapsed since the last plasma chamber cleaning and/or seasoning (in hours over the range of about 0 hours after cleaning and about 4 hours after seasoning to about 450 hours ), where the total amount of RF power-on time elapsed includes the RF power-on time for the polysilicon etch or the RF power-on time for both the mask trim plasma etch and the polysilicon plasma etch. The total amount of RF power-on time would include the RF power-on times for both the mask trim plasma etch and the polysilicon plasma etch only when a single chamber was used for both processes. The total amount of RF power-on time may include only the RF power-on times for the polysilicon plasma etch whether a single chamber was used for both processes or different chambers were used for mask trim plasma etch and polysilicon plasma etch.

For any given minimum ground-rule technology, neither C1 or C2 can be zero.

In one example the relationship between etch bias and trim time is of a linear relation of the form:

$$T_{BIAS}=A(W1-W3)+B \quad (2)$$

where A and B are empirically determined constants.

In step 265, the mask trim etch is performed for a first/next substrate of the lot using the just calculated trim time. In step 268, the lot for which steps 250, 255, 260 and 265 have been performed is started in the plasma etch tool. In step 275, the substrate is etched using a standard polysilicon etch recipe and time. In step 280, the polysilicon RF power-on and/or mask trim RF power-on time is recorded and added to the running total of RF power-on time since the last chamber cleaning and/or seasoning. In step 285 the next substrate of the lot is selected. If there are no further lots, then the method is done in step 287 until another lot is processed starting again at step 268. In step 290, a mode of applying the present invention is selected. The present invention can be run in a lot mode, where all substrates in the lot will be etched using the same mask trim etch time in which case the method loops back to step 270. The present invention can also be run in a single substrate mode, in which the mask trim etch time is recalculated for each substrate and in which case the method loops back to step 260. It should be understood that the running total of RF power-on time is reset to zero after a cleaning and/or seasoning.

FIG. 7 is a system diagram of a system architecture for etched line-dimension control in a plasma etch tool according to the present invention. In FIG. 7, APC module 205 (see FIG. 4) includes an outlier filter 295, a mask trim etch time algorithm solver 300, an APC feed forward controller 305, an RF power-on time collector 310, a total RF power-on time data storage unit 315 and a mask trim etch algorithm updater 320.

Preparatory to operation of APC module 205, lots of product, after being processed by lithography tool 325, are measured (mask feature W1, as described supra) and the measurement data is stored in SPC system 210. Outlier filter 295 retrieves the raw measurement data (i.e., continuing the example described supra, all 48 individual measurements of dimension W1 of the 48 mask feature that were measured) from SPC system 210 for the lot currently scheduled to be processed through resist etch and polysilicon etch tool 180.

Outlier filter 295 then removes any high or low individual measurements based on statistical analysis of the set of 48 measurements, and/or pre-programmed criteria such as discard any measurement above or below a fixed value. The outlier filter will then generate a single value of (W1) to send to mask trim etch time algorithm solver 300.

Mask trim etch algorithm updater 320 sends the latest value of the running total of RF power-on time ($T_{RF}$) since the last chamber cleaning and seasoning to mask trim etch time algorithm solver 300. Mask trim etch time algorithm solver 300 uses the mask feature dimension value (W1) and RF power-on time ($T_{RF}$) values as input to equation (1) described supra and calculates a mask trim etch time ($T_{TRIM}$) for the present lot or substrate. Mask trim etch time algorithm solver 300 includes (or accesses stored values of) a target value for the amount of time to perform the mask trim etch process ($T_{BIAS}$) and a target value for the mask feature measurement (WT1) based on the product type (or technology type, or lot number) to be etched.

Mask trim etch time algorithm solver 300 sends the mask trim etch time ($T_{TRIM}$) to APC feed forward controller 305 which sets the mask trim etch time parameter of a mask trim etch recipe stored in the APC module and instructs resist trim etch and polysilicon tool etch tool 180 to etch the substrate.

RF power-on time collector 310, collects the RF power-on time for the polysilicon etch (and optionally the mask trim etch) of the substrate just etched and passes the data to RF power-on elapsed time data storage 315 which adds the RF power-on time for the substrate just etched to the RF power-on time already stored to obtain the running total of RF power-on time ($T_{RF}$). Mask trim etch algorithm updater 320 accesses the RF power-on time ($T_{RF}$) as required.

Thus, the present invention provides a method and system for etched line-dimension control in a plasma etch tool that takes into account chamber cleaning and seasoning effects.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   measuring a mask feature of a patterned mask layer formed on a top surface of a layer on a substrate to obtain a mask feature dimension value;
   calculating a mask trim plasma etch time for said patterned mask layer based on said mask feature dimension value, a mask feature dimension target value, a total of selected radio frequency power-on times of a plasma etch tool since an event occurring to a chamber or chambers of said plasma etch tool for plasma etching said layer, and an etch bias target for a layer feature to be formed from said layer where said layer is not protected by said mask feature during a plasma etch of said layer; and
   performing a mask trim plasma etch of said patterned mask layer for said mask trim plasma etch time.

2. The method of claim 1, further including:
   performing said plasma etching of said layer after said performing said mask trim plasma etch.

3. The method of claim 2, wherein said calculating said mask trim plasma etch time is performed for a first substrate in a lot of one or more substrates and all substrates of said lot of one or more substrates are mask trim plasma etched for said mask trim plasma etch time and are layer plasma etched for a same layer plasma etch time.

4. The method of claim 2, wherein said calculating said mask trim plasma etch time is performed for each substrate in a lot of one or more substrates to generate a unique mask trim plasma etch time for each said substrate, and each substrates of said lot of one or more substrates are mask trim plasma etched for etched for a corresponding unique mask trim plasma etch time and are layer plasma etched for a same layer plasma etch time.

5. The method of claim 1, wherein said event is a cleaning or both a cleaning and seasoning of said plasma etch chamber of said plasma etch tool and said total of selected radio frequency power-on times is reset to zero after each said event.

6. The method of claim 1, wherein said selected radio frequency power-on times include all radio frequency power-on times of a layer plasma etch process or both all radio frequency power-on times of said layer plasma etch process and all radio frequency power-on times of a mask trim plasma etch process.

7. The method of claim 1, wherein said measuring a mask feature is performed on one or more mask features on one or more substrates of a lot of substrates.

8. The method of claim 1, wherein said etch bias target is said layer feature is based on an empirically determined relationship for applied mask trim plasma etch times versus measurement of resultant etch biases.

9. The method of claim 1, wherein said mask trim plasma etch time is calculated by the empirical relationship:

$$T_{TRIM} = (1 + T_{BIAS})^{(1+(\frac{W1-WT1}{WT1}))^2} + \left(1 + \frac{1}{T_{RF}^{C1}}\right)\ln(T_{RF})^{C2}$$

where:
WT1=said mask feature dimension target in microns;
$T_{TRIM}$=said mask trim plasma etch time in seconds over a range based upon a value of WT1;
$T_{BIAS}$=said etch bias target in seconds over a range based upon said value of WT1;
W1=said mask feature dimension in microns over a range based upon said value of WT1;
$T_{RF}$ said total amount of selected radio frequency power-on times in hours since the last cleaning and seasoning over a range based upon said value of WT1; and
C1 and C2 are empirically determined based upon a value of WT1.

10. The method of claim 1, wherein said mask trim plasma etch time is calculated by the empirical relationship:

$$T_{TRIM} = (1 + T_{BIAS})^{(1+(\frac{W1-WT1}{WT1}))^2} + \left(1 + \frac{1}{T_{RF}^{C1}}\right)\ln(T_{RF})^{C2}$$

where:
$T_{TRIM}$=said mask trim plasma etch time in seconds over a range of about 22 seconds to about 35 seconds;
$T_{BIAS}$=said etch bias target in seconds over a range of about 18 seconds to about 27 seconds;
W1 said mask feature dimension in microns over a range of about 0.112 microns to about 0.118 when microns when C1=1 and C2 =1 or over a range of about 0.082 microns to about 0.088 microns when C1=0.1 and C2=1.5;
WT1 said mask feature dimension target of about 0.115 microns when microns when C1=1 and C2=1 or about 0.085 microns when microns when C1=0.1 and C2=1.5; and
$T_{RF}$=said total amount of selected radio frequency power-on times in hours since the last cleaning and seasoning over the range of about 4 hours to about 450 hours.

11. The method of claim 1, wherein said mask feature comprises photoresist.

12. The method of claim 1, wherein said layer and said layer feature both comprise polysilicon.

13. A process control system, comprising a microprocessor and a memory unit coupled to communicate with said processor, said memory unit containing instructions that when executed implement a method for controlling an plasma etch process, said method comprising the microprocessor implemented steps of:
determining a mask feature dimension value of a mask feature of a patterned mask layer formed on a top surface of a layer on a substrate; and
calculating a mask trim plasma etch time for said patterned mask layer based on said mask feature dimension value, a mask feature dimension target value, a total of selected radio frequency power-on times of a plasma etch tool since an event occurring to a chamber or chambers of said plasma etch tool for plasma etching said layer, and an etch bias target for a layer feature to be formed from said layer where said layer is not protected by said mask feature during a plasma etch of said layer.

14. The system of claim 13, the method further including the steps of:
instructing said plasma etch tool to perform a mask trim plasma etch of said patterned mask layer for said mask trim plasma etch time; and
instructing said plasma etch tool to perform said plasma etch of said layer after completion of said mask trim plasma etch.

15. The system of claim 13, wherein said calculating said mask trim plasma etch time is performed for a first substrate in a lot of one or more substrates.

16. The system of claim 13, wherein said calculating said mask trim plasma etch time is performed for each substrate in a lot of one or more substrates.

17. The system of claim 13, wherein said event is a cleaning, or a cleaning and seasoning of said plasma etch chamber of said plasma etch tool.

18. The system of claim 13, wherein said selected radio frequency power-on times include said all radio frequency power-on times of layer plasma etch processes, or all radio frequency power-on times of layer plasma etch processes and all radio frequency power-on times of a mask trim plasma etch processes.

19. The system of claim 13, wherein said etch bias target for said layer feature is based on an empirically determined relationship for applied mask trim plasma etch times versus measurement of resultant etch biases.

20. The system of claim 13, wherein said mask trim plasma etch time is calculated by the empirical relationship:

$$T_{TRIM} = (1 + T_{BIAS})^{(1+(\frac{W1-WT1}{WT1}))^2} + \left(1 + \frac{1}{T_{RF}^{C1}}\right)\ln(T_{RF})^{C2}$$

where:
WT1=said mask feature dimension target in microns;
$T_{TRIM}$ =said mask trim plasma etch time in seconds over a range based upon a value of WT1;

$T_{BIAS}$ =said etch bias target in seconds over a range based upon said value of WT1;
W1=said mask feature dimension in microns over a range based upon said value of WT1;
$T_{RF}$=said total amount of selected radio frequency power-on times in hours since the last cleaning and seasoning over a range based upon said value of WT1; and
C1 and C2 are empirically determined based upon a value of WT1.

21. The system of claim 13, wherein said mask trim plasma etch time is calculated by the empirical relationship:

$$T_{TRIM} = (1 + T_{BIAS})^{(1+(\frac{W1-WT1}{WT1}))^2} + \left(1 + \frac{1}{T_{RF}^{C1}}\right)\ln(T_{RF})^{C2}$$

where:
$T_{TRIM}$=said mask trim plasma etch time in seconds over a range of about 22 seconds to about 35 seconds;
$T_{BIAS}$=said etch bias target in seconds over a range of about 18 seconds to about 27 seconds;
W1=said mask feature dimension in microns over a range of about 0.112 microns to about 0.118 when microns when C1=1 and C2 =1 or over a range of about 0.082 microns to about 0.088 microns when C1=0.1 and C2=1.5;
WT1=said mask feature dimension target of about 0.115 microns when microns when C1 =1 and C2=1 or about 0.085 microns when microns when C1=0.1 and C2=1.5; and
$T_{RF}$=said total amount of selected radio frequency power-on times in hours since the last cleaning and seasoning over the range of about 4 hours to about 450 hours.

22. A process control system, comprising:
a mask trim etch time algorithm solver adapted to generate a mask trim plasma etch time and linked to a feed forward controller, said feed forward controller adapted to integrate said mask trim plasma etch time into a plasma etch tool process recipe;
a radio frequency power-on collector adapted to collect plasma etch tool radio frequency power-on time and store a running total of radio frequency power-on time and linked to a data storage unit adapted to store said running total of radio frequency power-on time;
a mask trim etch time algorithm updater linked between said data storage unit and said mask trim etch algorithm solver and adapted to transfer said running total of radio frequency power-on time to said mask trim etch time algorithm solver.

23. The system of claim 22, further including an outlier filter linked to said mask trim etch time algorithm solver and adapted to transfer a filtered set of mask feature measurements to said mask trim etch time algorithm solver.

24. The system of claim 23, wherein said outlier filter removes individual mask feature measurements from a set of mask feature measurements based statistical analysis or programmed criteria.

25. The system of claim 23, wherein said running total of radio frequency power-on time includes all radio frequency power-on times of a layer plasma etch process or all radio frequency power-on times of both said layer plasma etch process and all radio frequency power-on times of a mask trim plasma etch process that have occurred after a specified event.

26. The system of claim 25, wherein said specified event is a cleaning or both a cleaning and seasoning of said plasma etch chamber of a plasma etch tool.

* * * * *